United States Patent [19]

DeMarco et al.

[11] Patent Number: 5,288,368
[45] Date of Patent: Feb. 22, 1994

[54] ELECTRON BEAM LITHOGRAPHY WITH REDUCED CHARGING EFFECTS

[75] Inventors: John J. DeMarco, East Brunswick; Christophe Pierrat, Basking Ridge, both of N.J.

[73] Assignee: AT&T Bell Laboratories, Murray Hill, N.J.

[21] Appl. No.: 25,714

[22] Filed: Mar. 2, 1993

Related U.S. Application Data

[63] Continuation-in-part of Ser. No. 993,866, Dec. 23, 1992, abandoned.

[51] Int. Cl.$^5$ .............. B44C 1/22; C03C 15/00; C23F 1/00
[52] U.S. Cl. .................... 156/643; 156/656; 156/659.1; 156/663; 156/904; 430/296; 430/330; 430/942
[58] Field of Search ............. 156/633, 643, 650, 656, 156/659.1, 662, 663, 668, 904; 430/5, 296, 313, 330, 942

[56] References Cited

U.S. PATENT DOCUMENTS

| | | | |
|---|---|---|---|
| 5,091,285 | 2/1992 | Watanabe et al. | 430/296 |
| 5,244,759 | 9/1993 | Pierrat | 430/5 |

OTHER PUBLICATIONS

Yano, K. et al., "A New Process for Reducing the Charging Effect in Electron Beam Lithography," *JJAP* Series 4, *Proc. of* 1990 *Intern.* MicroProcess Conference, pp. 147-150 (1990).

*Primary Examiner*—William Powell
*Attorney, Agent, or Firm*—David I. Caplan

[57] ABSTRACT

A direct-writing electron beam is used for defining features in a resist layer and hence ultimately in an underlying workpiece, such as in a phase-shifting mask substrate or a semiconductor integrated circuit wafer. The resist layer is located on a top major surface of the workpiece.

In a specific embodiment, the resist layer is located underneath a protective layer of polyvinyl alcohol ("PVA"); and a grounded conductive layer, such as a conductive organic layer, is located on the protective layer. After exposing the top major surface of the resulting structure to the direct-writing electron beam, the following steps are performed:

(1) a plasma etching completely removes the entire thickness of the conductive layer as well as a small fraction of the thickness of the PVA layer;
(2) the PVA layer is then completely removed by dissolving it in water;
(3) another plasma etching removes a small fraction of the thickness of the resist layer, including any unwanted residues; and
(4) the resist layer is developed.

12 Claims, 2 Drawing Sheets

ELECTRON BEAM LITHOGRAPHY WITH REDUCED CHARGING EFFECTS

This application is a continuation-in-part of application Ser. No. 07/993,866, filed on Dec. 23, 1992, abandoned.

TECHNICAL FIELD

This invention relates to charged beam lithography and more particularly to direct-writing electron beam lithography.

BACKGROUND OF THE INVENTION

Charged beam lithography involves bombarding a resist layer with a scanning charged beam whose intensity varies with time (i.e., a spatially selective scanning beam having a prescribed resulting lateral pattern). The charged beam is typically an electron beam (a "direct-writing electron beam"). The resist layer is located on a workpiece. The workpiece typically comprises a transparent substrate to be used for a phase-shifting mask or a semiconductor wafer to be used for an integrated circuit.

The resist layer is developed after the bombardment, whereby a desired pattern of openings is formed in the resist layer in accordance with the resulting lateral pattern of the charged beam. Then the thus patterned resist layer is used for defining features in the workpiece—i.e., for patterning the workpiece in accordance with the lateral pattern of the beam, using the patterned resist layer as a patterned mask. For example, using a semiconductor wafer as the workpiece, the patterned resist layer is bombarded with ions that are thus implanted into the wafer or that react with the wafer to form indentation ("recess") regions in the wafer. Alternatively, the patterned resist layer is used as a patterned mask for the deposition of patterned metal layers on the wafer, in order to metallize integrated circuits. Using a transparent substrate (with a patterned layer of opaque portions on typically one of its major surfaces) the patterned resist layer is used as a patterned mask for spatially selectively removing portions of the thickness of the transparent substrate, or portions of the thickness of the opaque layer, or of both—i.e., portions of the workpiece. Moreover, the patterned resist layer is typically completely removed after being used as a patterned mask in conjunction with the semiconductor wafer or with the transparent substrate.

A known method for defining a desired pattern in a resist layer involves exposing the resist layer to a direct-writing, scanning electron beam, followed by wet developing the resist layer, whereby the desired patterned resist layer is formed. One problem that arises is called "charging effects"—that is, electronic charges that are introduced by the electron beam at earlier moments of times during the scanning undesirably laterally deflect the electron beam at neighboring locations at subsequent moments of time, whereby the resulting pattern of exposure of the resist layer to the electron beam is not the same as was desired.

In a paper authored by Keiko Yano et al., entitled "A New Process for Reducing the Charging Effect in Electron Beam Lithography," and published in *JJAP Series 4, Proc. of 1990 Intern. MicroProcess Conference,* pp. 147-150 (1990), a method of patterning an electron-beam-sensitive resist layer is taught with desirably reduced charging effects. In that method, a direct-writing (scanning) electron beam is used for producing the desired pattern in the resist layer after the latter has been exposed to the beam and has been wet developed, but with the addition of a grounded electrically conductive organic layer overlying the resist layer during the electron beam bombardment of the resist layer, and with the addition of an intermediate protective layer intervening between the conductive organic layer and the resist layer. The conductive organic layer is transparent to the electron beam, and its purpose is to remove the undesirable charges by conducting them to ground.

The conductive organic layer is formed by spin-coating from a solution of the polymer in an organic solvent. The purpose of the intermediate protective layer is to suppress undesirable global removal of the resist layer by the organic solvent during the spin-coating process. Ibis protective layer can simply be a polyvinyl alcohol (hereinafter "PVA") layer, which can be removed—subsequent to a removal of the conductive organic layer after the electron bombardment has been completed—by means of simply dissolving it in water.

Disadvantages of the foregoing method can arise from a formation and subsequent accumulation of unwanted polymer residues at the interface of the PVA and resist layers. More specifically, the unwanted residues can coat the workpiece and thus render it difficult to transfer the pattern of the patterned resist layer to the workpiece. Disadvantages can also arise from the random localized formation of unwanted pinholes in the resist layer during the removal of the conductive organic layer, owing to the porousness of the PVA layer and to the solubility of the resist in the organic solvent that is used to dissolve the conductive organic layer. More specifically, pinholes in the protective layer enable the solvent, which is subsequently used for removing the conductive organic layer after the electron bombardment has been completed, to penetrate down to, and to dissolve localized portions of, the resist layer. Therefore, alleviation of one or both of these disadvantages is desirable.

SUMMARY OF THE INVENTION

In accordance with the method of this invention, a workpiece is patterned (i.e., a feature is defined or delineated in the workpiece) in accordance with the lateral pattern of a spatially selective, electrically charged, scanning beam of actinic radiation. The method comprises the steps of:

(a) directing the beam at a major surface of an electrically conductive layer that is transparent to the beam, such as a conductive organic layer, the conductive layer being located overlying a resist layer that is sensitive to the beam, the resist layer being located overlying the workpiece;

(b) removing the entire thickness of the conductive layer by means of dry etching; and (c) developing the resist layer, whereby the resist layer becomes a patterned resist layer in accordance with the lateral pattern.

The term "actinic" is used to denote radiation—such as a beam of electrons—that modifies the development properties of the resist layer wherever the beam of actinic radiation impinges on it.

Advantageously, the conductive layer and the resist layer have uniform respective thicknesses, and the conductive layer is essentially an organic layer.

Advantageously also, in this inventive method a protective layer intervenes between the conductive layer and the resist layer, while the method further comprises, between steps (b) and (c), the step of removing a fraction of the thickness of the protective layer by means of dry etching, followed by the step of removing the entire remaining thickness of the protective layer by means of dissolving it in a liquid solvent. It is further advantageous that the method also comprise, after removing the protective layer, and before developing the resist layer, the step of removing only a (typically small) fraction of the thickness of the resist layer by means of dry etching, typically with oxygen. It is also further advantageous that the dry etching mentioned in step (b) is etching with oxygen. It is also further advantageous that the step of removing only a portion of the thickness of the resist layer is performed by etching with oxygen.

The dry etching of the conductive layer mitigates the problem arising from the porousness of the protective layer, and the dry etching of a (small) fraction of the thickness of the resist layer serves to remove remaining residues, if any, that may reside on the surface of the resist layer. As used herein, the term "dry etching" includes such etching processes as reactive ion etching ("RIE"), chemically assisted ion beam etching ("CAIBE"), plasma mode etching, ion milling, electron (cyclotron resonance) beam etching, and microwave etching.

BRIEF DESCRIPTION OF THE DRAWING(S)

FIGS. 1-6 are cross-sectional elevational views of successive stages of implementation of a lithographic process in accordance with a specific embodiment of the invention.

Only for the sake of clarity, none of the drawings is to scale.

DETAILED DESCRIPTION

Figure 1:
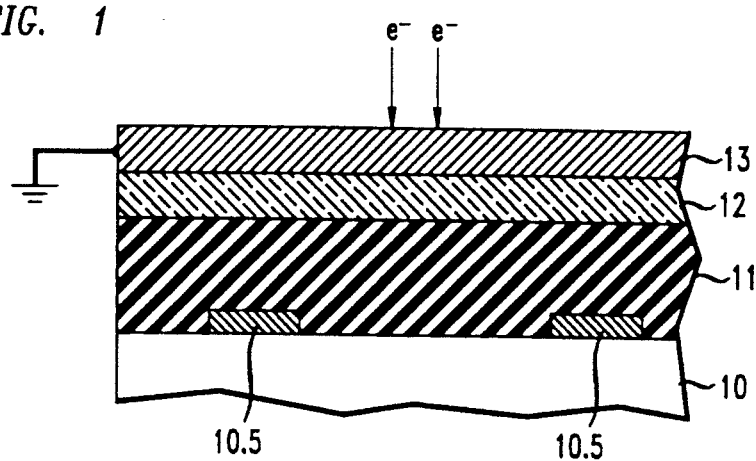

Referring to FIG. 1, a structure 100 comprises a transparent substrate 10, such as quartz, on whose top major surface a patterned chromium layer 10.5 has been formed. The structure 100 represents an early stage in the fabrication of a phase-shifting mask. The structures 200, 300, 400, 500, and 600 represent successive later stages.

An electron-beam-sensitive resist layer 11 overlies both the chromium layer 10.5 and the substrate 10. An intermediate protective layer 12, typically polyvinylalcohol ("PVA"), overlies the resist layer 12; and a grounded electrically conductive organic layer 13 overlies the protective layer 12. The protective PVA layer 12 typically has a thickness of 0.15 $\mu$m.

The conductive layer 13, for example, is a spun-on crystallized solution of a complex TCNQ salt, such as N=actylisoquinolinium-tetracyanoquinodimethan, a polymer resin, and an organic solvent. Such a solution can be obtained from Nitto Chemical Industry Co. Ltd., Yokohama, Japan, and is imported into the United States and sold by Nagase California Corporation, Sunnyvale, Calif. 94086. This conductive layer 13 typically has a thickness of approximately 0.1 $\mu$m.

While the conductive layer 13 is grounded, a direct writing electron beam 15 spatially selectively scans and hence bombards certain portions of, among other things, the resist layer 11, according to a pattern determined by the lateral pattern of the scanning electron beam. In this way, the thus electron-bombarded portions of the resist layer 11 receive a 10 KeV electronic charge dose typically in the approximate range of 1.0-to-1.2 $\mu$c/cm$^2$ (micro-coulomb per square centimeter) for a resist layer comprising poly(butene sulfone) having a thickness of approximately 0.7 $\mu$m. In this way, the thus electron bombarded portions of the resist layer are sensitized to a subsequent development process, as described more fully below.

Figure 2:
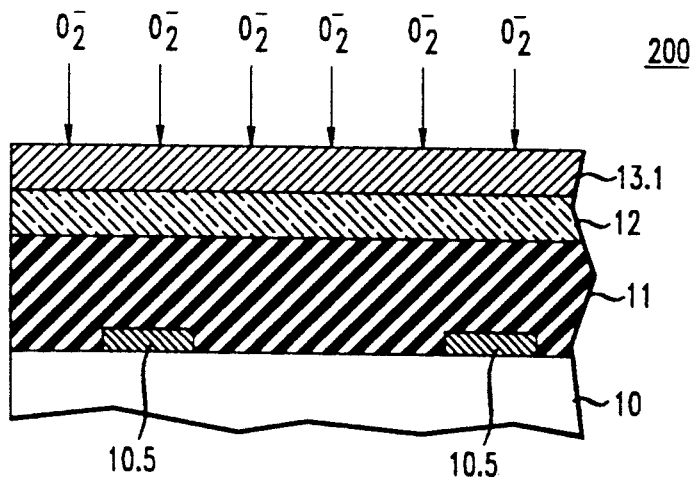
Figure 3:
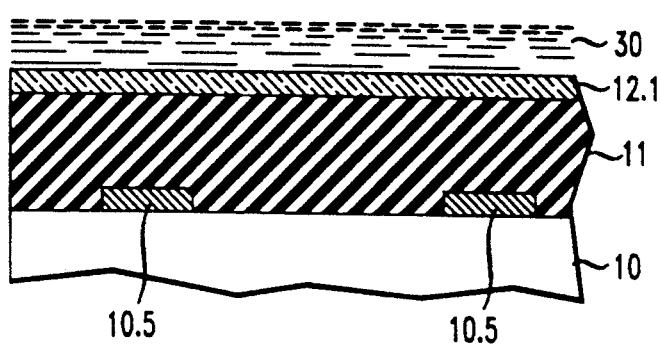

Next (FIG. 2), the conductive layer 13 is removed by dry etching it with an oxygen ion plasma. The layer 13.1 (FIG. 2) represents the thickness of the layer 13 that remains in the structure 200 during an intermediate stage of the etching. This etching is continued so that a small portion of the thickness—typically approximately 0.05 $\mu$m—of the protective PVA layer 12 is also removed. Then (FIG. 3), the PVA layer 12 is completely removed, as by dissolving it in water solution 30. The layer 12.1 (FIG. 3) represents the thickness of the layer 12 that remains in the structure 300 during an intermediate stage of this dissolution in water.

Next (FIG. 4), an oxygen plasma removes, by dry etching, a small fraction of the thickness of the resist layer 11. Typically this thus removed thickness is approximately 0.05 $\mu$m in case the resist layer 11 has the above-mentioned typical original thickness.

Figure 4:
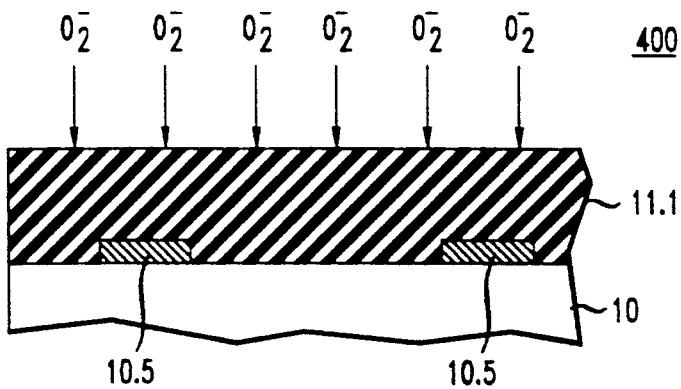
Figure 5:
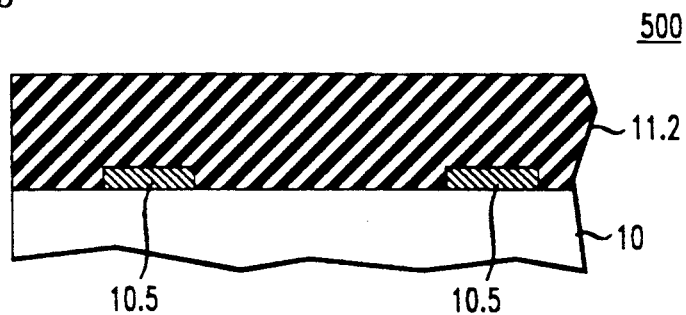

In FIG. 4 the resist layer 11.1 corresponds to an intermediate stage of the resulting structure 400 during this etching; in FIG. 5 the resist layer 11.2 corresponds to the stage of the resulting structure 500 that is attained after this etching has been completed.

Figure 6:
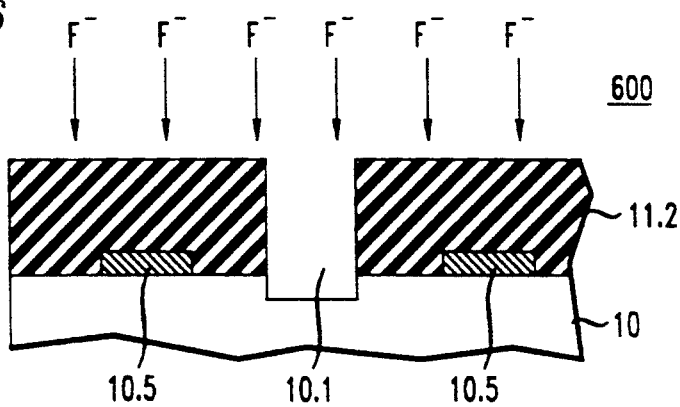

Thereafter, an aperture (FIG. 6) is formed in the resist layer 11.2, typically by wet development. Next, a suitable reactive ion etching flood beam, typically containing fluoride ions, is directed at the top surface of structure being fabricated in order to etch the quartz substrate 10 in a region thereof underlying the aperture in the resist layer 11.2. In this way, the structure 600 is attained—namely, with an indentation ("recess") region 10.1 formed in the quartz substrate 10 in a region underlying the aperture that had been formed in the resist layer 11. 2. Alternatively, wet etching the quartz with wet hydrofluoric acid (HF) can be used to form the recess region 10.1 in the substrate 10.

Next, the resist layer 11.2 is removed (not shown), as by means of an organic solvent, as known in the art. The structure thus formed can then be used as a phase-shifting lithographic mask.

Although the invention has been described in detail in terms of a specific embodiment, various modifications can be made without departing from the scope of the invention. For example, instead of a transparent substrate 10, a semiconductive substrate can be used in combination with—instead of the bombardment with fluoride ions through the aperture in the resist—an implantation of impurity or other ions into the semiconductive substrate, or a dry itching of the substrate with chlorine ions, or a deposition of a material such as metal, in order to create an ion implanted region in the semiconductive substrate, or to produce a recess in the substrate, or to produce a patterned metallization, respectively, for semiconductor integrated circuits.

Instead of dry etching the conductive layer or the protective layer (or both) with an oxygen plasma, other gases can be used such as nitrogen, sulfur dioxide, or a mixture of such gases. Instead of using a scanning electron beam as the actinic radiation beam, a scanning ion beam can be used.

We claim:

1. In a method of patterning a workpiece in accordance with the lateral pattern of a spatially selective, electrically charged, scanning beam of actinic radiation, the steps of (a) directing the beam at a major surface of a conductive layer that is located overlying a resist layer that is sensitive to the beam, the conductive layer being transparent to the beam, the resist layer being located overlying the workpiece;

(b) removing the entire thickness of the conductive layer by means of dry etching; and (c) developing the resist layer, whereby the resist layer becomes a patterned resist layer in accordance with the pattern of the beam.

2. The method of claim 1 in which the conductive layer comprises an organic layer.

3. The method of claim 2, in which a protective layer intervenes between the conductive and resist layers, further comprising between steps (b) and (c)

the step of removing a fraction of the thickness of the protective layer by means of dry etching, followed by the step of removing the entire remaining thickness of the protective layer by means of dissolving it in a liquid solvent.

4. The method of claim 3 further comprising, after step (c), the step of defining a feature in or on the workpiece using the patterned resist layer as a patterned protective mask.

5. The method of claim 4 in which the dry etching of step (b) is etching with oxygen.

6. The method of claim 3 further comprising, after removing the entire thickness of the protective layer and before step (c), the step of removing only a fraction of the thickness of the resist layer by means of dry etching.

7. The method of claim 6 further comprising, after step (c), the step of defining a feature in or on the workpiece using the patterned resist layer as a patterned protective mask.

8. The method of claim 7 in which the dry etching of step (b) is etching with oxygen.

9. The method of claim 8 in which the step of removing only a portion of the thickness of the resist layer is performed by etching with oxygen.

10. The method of claim 9 further comprising, after step (c), the step of defining a feature in or on the workpiece using the patterned resist layer as a patterned protective mask.

11. The method of claim 7 in which the step of removing only a portion of the thickness of the resist layer is performed by etching with oxygen.

12. The method of claim 1 in which step (b) comprises etching with oxygen.

* * * * *